(12) United States Patent
Liang et al.

(10) Patent No.: US 7,402,866 B2
(45) Date of Patent: Jul. 22, 2008

(54) BACKSIDE CONTACTS FOR MOS DEVICES

(75) Inventors: Mong Song Liang, Hsin-Chu (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 11/475,707

(22) Filed: Jun. 27, 2006

(65) Prior Publication Data

US 2007/0296002 A1 Dec. 27, 2007

(51) Int. Cl.
*H01L 27/01* (2006.01)
(52) U.S. Cl. .................... 257/347; 257/758
(58) Field of Classification Search ............ 257/347, 257/758, 384, 508
See application file for complete search history.

(56) References Cited

U.S. PATENT DOCUMENTS

| | | | |
|---|---|---|---|
| 6,407,427 B1 * | 6/2002 | Oh | 257/347 |
| 6,483,147 B1 | 11/2002 | Lin | |
| 6,921,961 B2 | 7/2005 | Sanchez et al. | |
| 6,958,285 B2 | 10/2005 | Siniaguine | |
| 6,979,651 B1 | 12/2005 | Hellig et al. | |
| 7,005,380 B2 | 2/2006 | Aminpur et al. | |
| 2003/0203546 A1 | 10/2003 | Burbach et al. | |
| 2005/0253175 A1 | 11/2005 | Taddiken | |
| 2007/0267698 A1 * | 11/2007 | Bernstein et al. | 257/347 |

* cited by examiner

*Primary Examiner*—Mark Prenty
(74) *Attorney, Agent, or Firm*—Slater & Matsil, L.L.P.

(57) ABSTRACT

A semiconductor structure includes a semiconductor substrate having a first surface and a second surface opposite the first surface, a gate dielectric over the first surface of the semiconductor substrate, a gate electrode over the gate dielectric, a source/drain region having at least a portion in the semiconductor substrate, a dielectric layer having a first surface and a second surface opposite the first surface wherein the first surface of the dielectric layer adjoins the second surface of the semiconductor substrate, and a contact plug in the dielectric layer, wherein the contact plug extends from a bottom side of the source/drain region to the second surface of the dielectric layer.

18 Claims, 6 Drawing Sheets

BACKSIDE CONTACTS FOR MOS DEVICES

TECHNICAL FIELD

This invention relates generally to semiconductor devices, and more particularly to the methods and structures for forming MOS devices having a highly stressed contact etch stop layer.

BACKGROUND

The scaling of VLSI circuits is a constant effort. Smaller integrated circuits allow more devices to be formed in one semiconductor chip. Additionally, power consumption and performance are also improved. With circuits becoming smaller and faster, improvement in device driving current is becoming more important, which can be increased by improving carrier mobility. Among efforts made to enhance carrier mobility, forming a stressed channel region is a known practice. The performance of a MOS device can be enhanced through a stressed-surface channel. This technique allows performance to be improved at a constant gate length without adding complexity to circuit fabrication or design.

It has been well known that tensile stress can improve NMOS device performance and compressive stress can improve PMOS device performance. A commonly used method for applying stress to the channel region is to form a stressed contact etch stop layer (CESL) on a MOS device. The stressed CESL introduces a stress into the channel region. Therefore, the carrier mobility is improved. Typically, there are three factors affecting the stress that can be applied by the CESL. The first factor is the inherent stress in the CESL. Currently, inherent stresses are capped at about 2 GPa for tensile stresses and about −3 GPa for compressive stresses. The second factor is the thickness of the CESL. Thicker CESLs apply higher stresses to the channel regions. However, the thicknesses of the CESLs are limited by design rules and the critical dimension. The third factor is cutting effects, which are partially determined by how far away the CESL extends from the source/drain regions. The further the CESL extends, the smaller the cutting effects, and the greater the stresses that are applied.

Cutting effects may be caused by the formation of contact plugs. To form contact plugs, openings have to be formed in the CESLs, and thus the stresses applied by the CESLs are adversely affected. It has been found that a stress in a channel region is related to the distance between a central line of a gate electrode and the nearest edge of contact plugs. The greater the distance, the greater the stress that is applied. When the MOS devices become smaller, the distance becomes smaller, and the stress is reduced more. Such a problem is expected to worsen for future-generation integrated circuits. A semiconductor device that may overcome the previously discussed deficiencies of the prior art is thus needed.

SUMMARY OF THE INVENTION

In accordance with one aspect of the present invention, a semiconductor structure includes a semiconductor substrate having a first surface and a second surface opposite the first surface, a gate dielectric over the first surface of the semiconductor substrate, a gate electrode over the gate dielectric, a source/drain region having at least a portion in the semiconductor substrate, a dielectric layer having a first surface and a second surface opposite the first surface wherein the first surface of the dielectric layer adjoins the second surface of the semiconductor substrate, and a contact plug in the dielectric layer, wherein the contact plug extends from a bottom side of the source/drain region to the second surface of the dielectric layer.

In accordance with another aspect of the present invention, a semiconductor structure includes a semiconductor layer comprising a first side, and a second side opposite the first side, a buried oxide (BOX) layer directly on a top surface of the second side of the semiconductor layer, a gate dielectric over a top surface of the semiconductor layer on the first side, a gate electrode over the gate dielectric, a source/drain region in the semiconductor layer wherein the source/drain region and the BOX layer have an interface, a first contact plug in the dielectric layer and connected to the interface, an over-device metallization layer over and on the first side of the semiconductor layer, and an under-device metallization layer on the second side of the semiconductor layer, wherein the under-device metallization layer is connected to the first contact plug, and wherein the over-device metallization layer and the under-device metallization layer are electrically interconnected through contact plugs.

In accordance with yet another aspect of the present invention, a semiconductor structure includes a semiconductor substrate having a first surface and an opposing second surface, a gate dielectric over the first surface of the semiconductor substrate, a gate electrode over the gate dielectric, a source/drain region having at least a portion in the semiconductor substrate, a contact etch stop layer (CESL) over the gate electrode and the source/drain region, wherein the CESL has an inherent stress, a dielectric layer having a first surface and an opposing second surface, wherein the first surface of the dielectric layer adjoins the second surface of the semiconductor substrate, and a first contact plug in the dielectric layer, wherein the first contact plug extends from a bottom side of the source/drain region to the second surface of the dielectric layer.

In accordance with yet another aspect of the present invention, a method for forming a semiconductor structure includes providing a semiconductor layer comprising a first side and a second side opposite the first side wherein a buried oxide (BOX) layer is directly on a surface of the second side of the semiconductor layer, forming a gate dielectric over a top surface of the semiconductor layer on the first side, forming a gate electrode over the gate dielectric, forming a source/drain region in the semiconductor layer wherein the source/drain region extends to the BOX layer and wherein the source/drain region and the BOX layer have an interface, forming a first contact plug extending from a bottom surface of the dielectric layer to an opposite surface of the dielectric layer, forming an over-device metallization layer over and on the first side of the semiconductor layer, forming an under-device metallization layer over and on the second side of the semiconductor layer, and interconnecting the over-device metallization layer and the under-device metallization layer.

In accordance with yet another aspect of the present invention, a method for forming a semiconductor structure includes providing a semiconductor layer comprising a first side and a second side opposite the first side, wherein a buried dielectric layer is directly on a top surface on the second side of the semiconductor layer, and wherein the buried dielectric layer is further on a disposable substrate. The method further includes forming a gate dielectric over a top surface on the first side of the semiconductor layer, forming a gate electrode on the gate dielectric, forming a source/drain region having at least a portion in the semiconductor substrate wherein the source/drain region extends to the buried dielectric layer and wherein the source/drain region and the buried layer have an interface, removing the disposable substrate to expose the buried dielectric layer, forming a first contact plug in the buried dielectric layer wherein the first contact plug physically connects to a bottom side of the source/drain region, and forming an under-device metallization layer on the second side of the dielectric layer and connected to the first contact plug.

By forming backside contact plugs, cutting effects are reduced, and stresses applied by the contact etch stop layer are increased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The cross-sectional views of the intermediate stages in the manufacture of preferred embodiments are illustrated in FIGS. 1 through 14, wherein like reference numbers are used to designate like elements throughout the various views and illustrative embodiments of the present invention.

Figure 1:
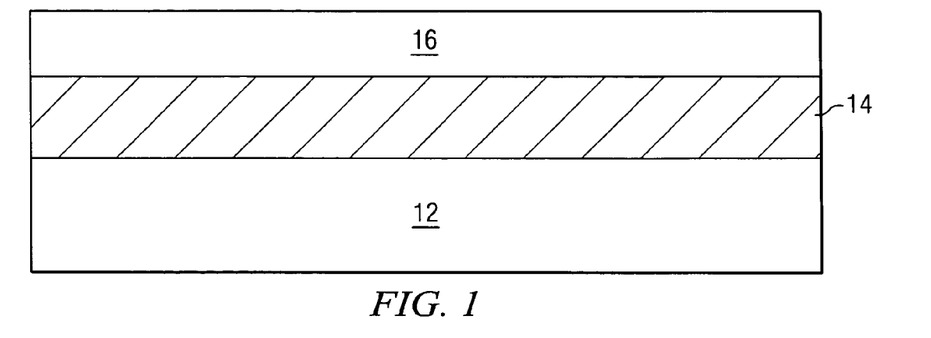
FIGS. 1 through 10 are cross-sectional views of intermediate stages in the manufacture of a first embodiment, wherein over-device metallization layers are formed over a MOS device.

FIG. 1 illustrates a silicon-on-insulator structure, which includes a first substrate 12, a thin buried insulation layer 14 and a second substrate 16. Throughout the description, buried insulation layer 14 is alternatively referred to as buried oxide (BOX) 14 since it is commonly formed of oxides. The first substrate 12 is preferably a semiconductor substrate comprising, for example, silicon or silicon germanium. Alternatively, the first substrate 12 is a dielectric substrate comprising a same, or more preferably, a different dielectric material from BOX 14. Second substrate 16 is preferably a pre-doped silicon substrate. It can also be Ge, SiGe, SiGeC, or the like. The thickness of second substrate 16 is preferably less than about 80 nm, and more preferably between about 40 nm and about 70 nm.

Figure 2:
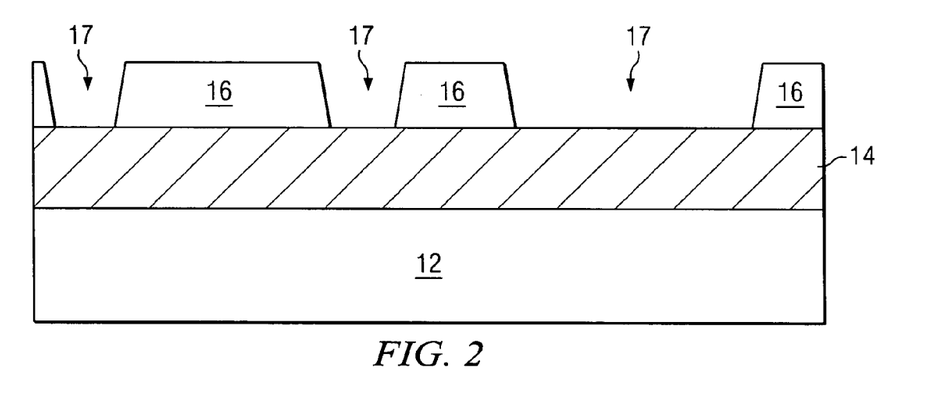
Figure 3:
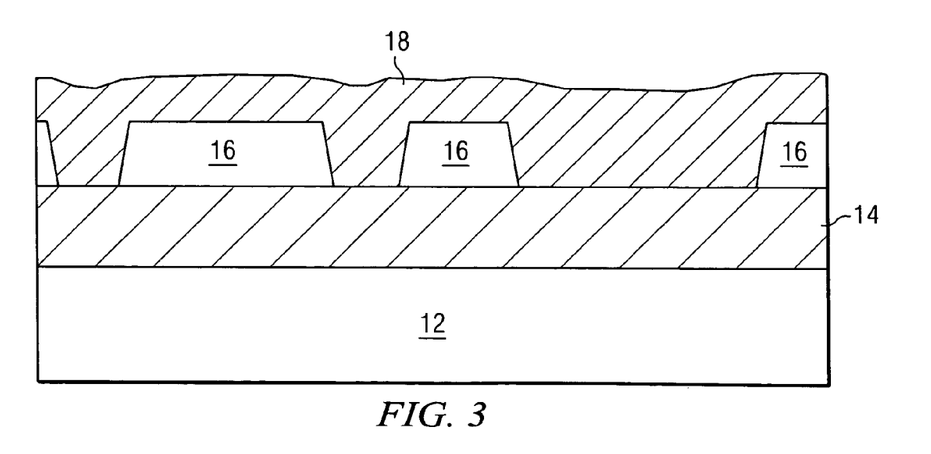
Figure 4:
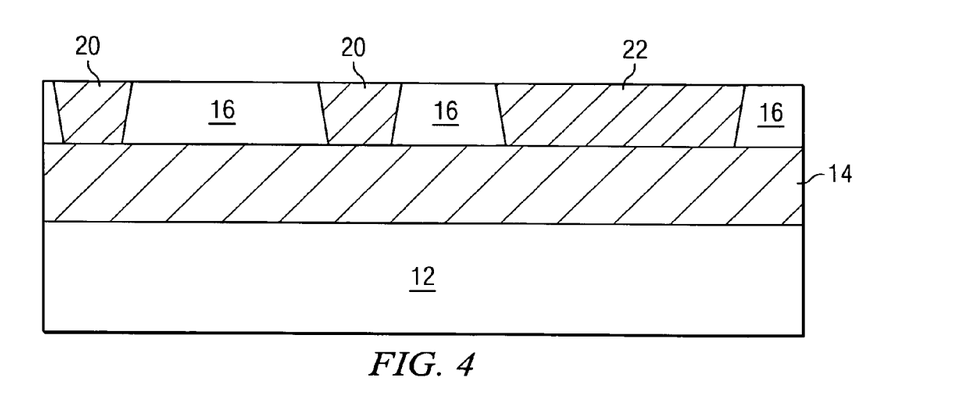

Referring to FIG. 2, openings 17 are formed in second substrate 16, preferably by anisotropically etching second substrate 16. Preferably, end-point mode is used so that BOX 14 is exposed through openings 17. FIG. 3 illustrates the filling of openings 17 with a dielectric material 18, which preferably comprises high-density plasma oxide, although other dielectric materials such as nitrides and oxynitrides may also be used. The preferred deposition methods include atomic layer deposition (ALD), low-pressure chemical vapor deposition (LPCVD), high-density plasma chemical vapor deposition (HDPCVD), and the like. A chemical mechanical polish (CMP) is then performed to remove excess dielectric material 18, and thus a structure as shown in FIG. 4 is formed. The remaining portions of dielectric material 18 form shallow-trench-isolation (STI) regions 20 and 22.

Figure 5:
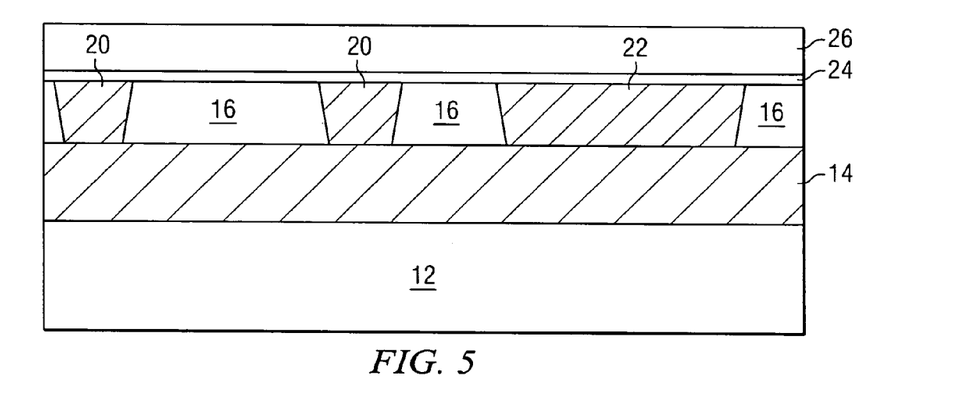

In the subsequent process steps, a MOS device is formed in an active region of second substrate 16 defined by STI regions 20. In the preferred embodiment, as shown in FIG. 5, a gate dielectric layer 24 is formed on second substrate 16 and STI regions 20 and 22. Gate dielectric layer 24 preferably comprises commonly used gate dielectric materials, such as silicon oxide, high-k dielectrics, and the like. A gate electrode layer 26 is formed on gate dielectric layer 24. Gate electrode layer 26 preferably includes polysilicon, although it may comprise metals, metal silicides, and the like. The preferred metals include titanium, tungsten, cobalt, aluminum, nickel, and combinations thereof.

Figure 6:
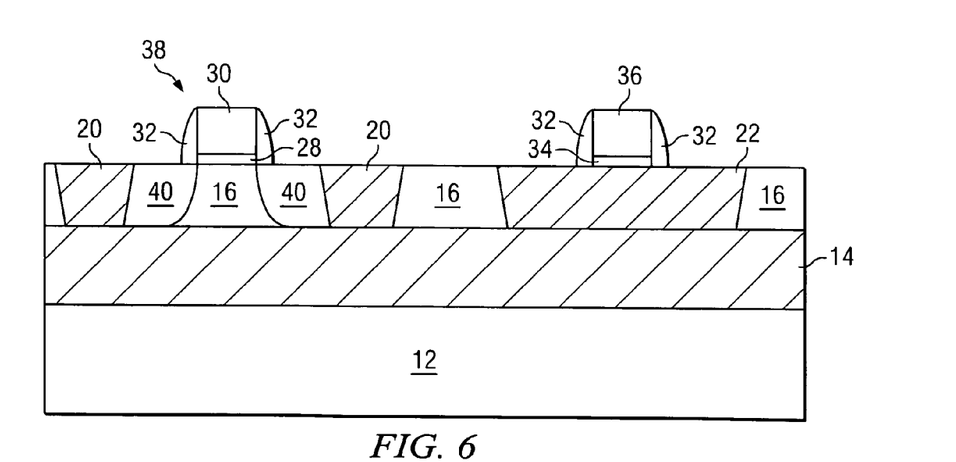

Gate dielectric layer 24 and gate electrode layer 26 are then patterned to form the gate structures, as is illustrated in FIG. 6. On the active region defined by STI regions 20, a gate stack, including a gate dielectric 28 and a gate electrode 30, is formed. A further gate stack, which includes a dielectric layer 34 and a connecting electrode 36, is also formed on STI region 22. Spacers 32 are then formed along the sidewalls of the gate stacks. Spacers 32 may be formed by well-known methods such as blanket depositing a dielectric layer and then anisotropically etching to remove the dielectric layer from the horizontal surfaces. Source/drain regions 40 are then formed, preferably by doping the active region defined by STI regions 20. Preferably, source/drain regions 40 extend to the bottom of second substrate 16, and thus interface directly with BOX 14. Alternatively, source/drain regions 40 may be shallower than second substrate 16. The resulting MOS device is denoted as MOS device 38. Gate electrode 30 and connecting electrode 36 are preferably doped to reduce contact resistance.

Figure 7:
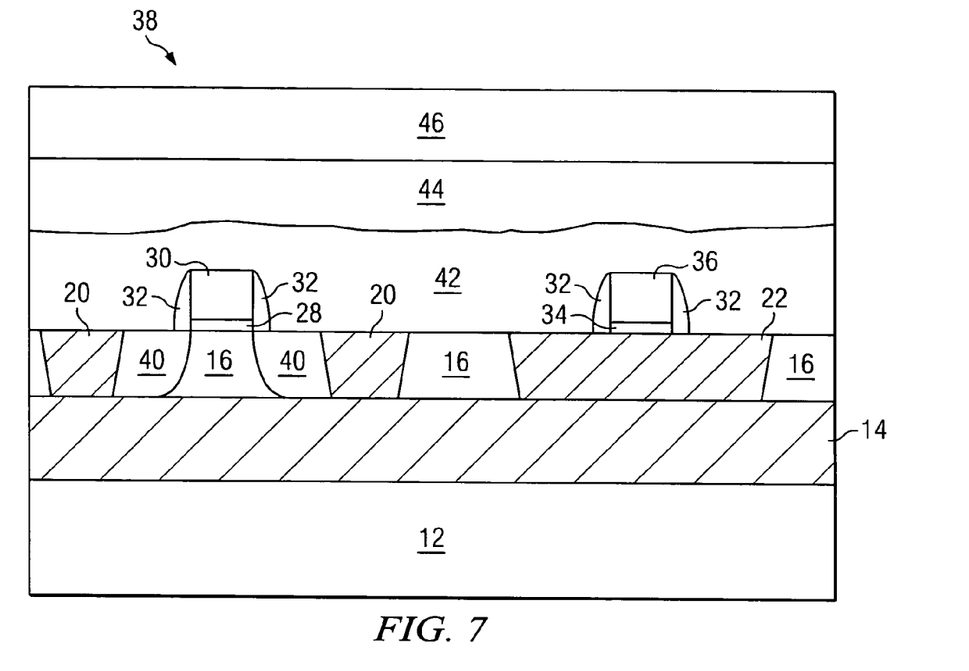

FIG. 7 illustrates the formation of a contact etch stop layer (CESL) 42, an inter-layer dielectric (ILD) 44 and a dielectric layer 46. CESL 42 may be formed using low-pressure chemical vapor deposition (LPCVD), but other CVD methods, such as plasma enhanced chemical vapor deposition (PECVD), and thermal CVD may also be used. The material of CESL 42 is preferably selected not only for its dielectric properties, but also for its ability to provide a high stress to the channel region of MOS device 38. Since the subsequently formed source/drain contacts will not be formed through CESL 42 (as will be discussed below with reference to FIG. 8), CESL 42 may be thick without causing problems with the contact hole etching. The thickness of CESL 42 is preferably between about 700 Å and about 2000 Å, although a thinner or thicker CESL 42 may be formed, depending on the design rule. Next, ILD 44, which preferably has a low k value, is formed, followed by the formation of a dielectric layer 46. In one embodiment, dielectric layer 46 is a temporary layer that will be removed in a subsequent process. In other embodiments, dielectric layer 46 is a passivation layer, which is used for preventing moisture penetration and foreign ion contamination. Passivation layer 46 preferably comprises materials such as silicon oxide, silicon oxynitride (SiON), polyimide, silicon nitride (SiN), silicon oxycarbide (SiOC), and the like.

Figure 8:
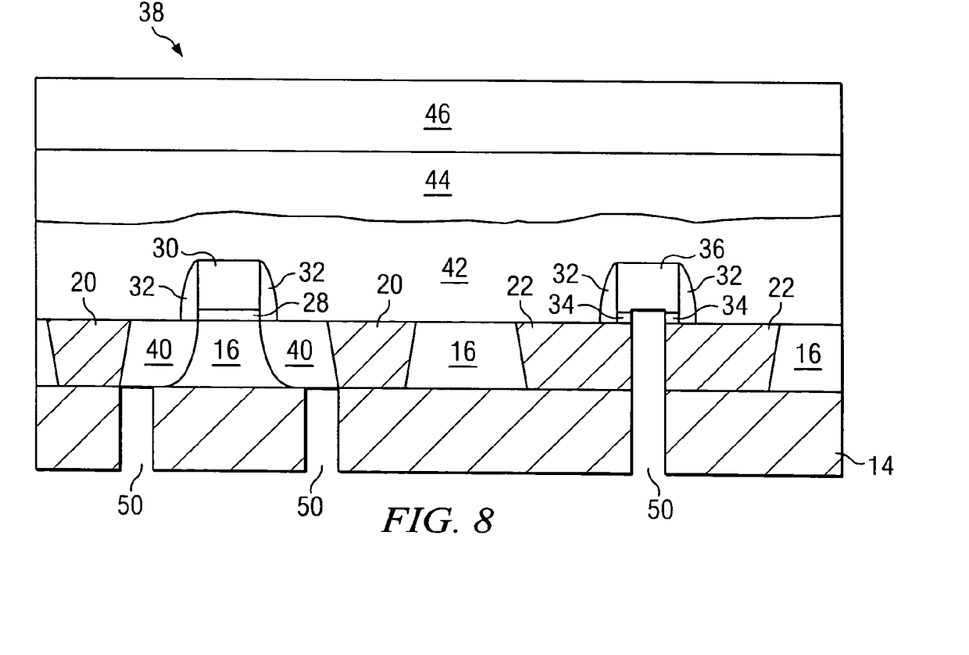

Referring to FIG. 8, substrate 12 is removed, for example, using CMP, during which dielectric layer 46 is used to protect the already formed circuitry. BOX 14 is exposed. In practical formation processes, the substrate is flipped over. Next, openings 50 are formed in BOX 14, and the bottoms of source/drain regions 40 are exposed through the openings 50. Under connecting electrode 36, an opening 50 extends into STI region 22 and further into dielectric layer 34, and the connecting electrode 36 is also exposed through the underlying opening 50. Preferably, openings 50 are formed as close to STI regions 20 as possible to stay away from the interface between source/drain regions 40 and second substrate 16. Openings 50 may also have an overlapping region with the respective STI regions 20 for easier alignment.

Figure 9:
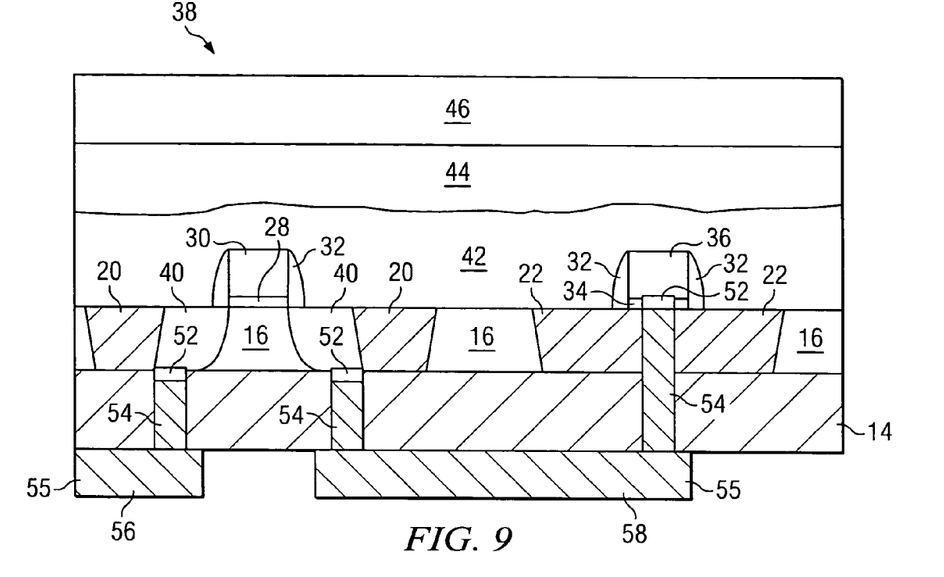

FIG. 9 illustrates the formation of an under-device metallization layer 55 adjoining BOX 14. In the preferred embodiment, silicide regions 52 are formed at the bottoms of source/drain regions 40, preferably using conventional salicide processes. Contact plugs 54 are then filled in openings 50. An under-device metallization layer 55 is then formed, which includes metal lines 56 and 58. Metal line 58 connects one of the source/drain regions 40 to the connecting electrode 36 through a contact plug 54. Metal line 56 will connect the other source/drain region 40 to another similar connecting electrode (not shown). The formation processes for silicide regions 52 and metallization layer 55 are well known in the art, thus are not repeated herein.

Figure 10:
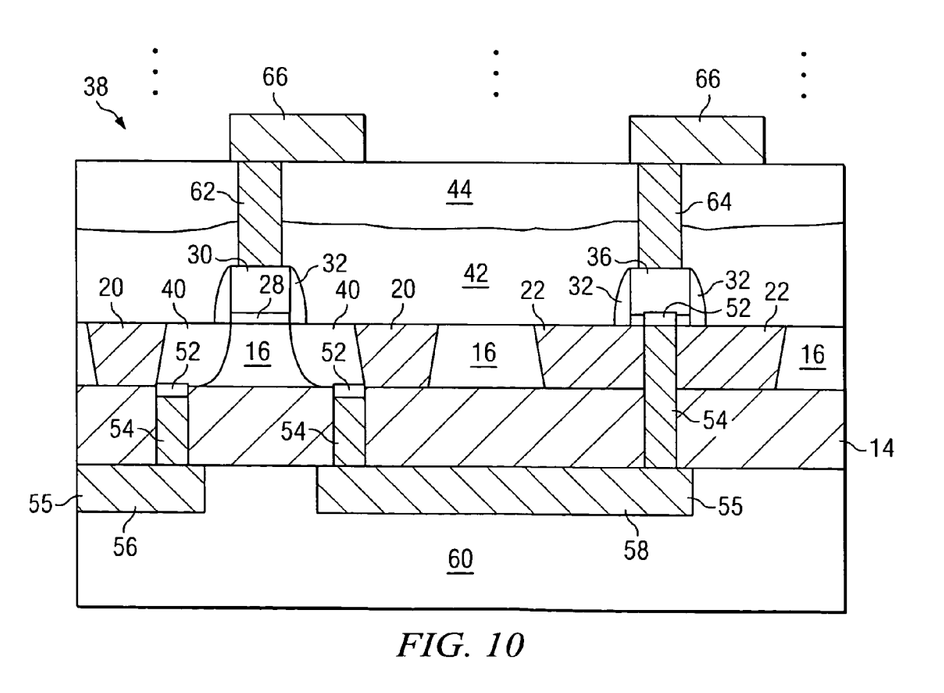

Referring to FIG. 10, a passivation layer 60 is formed covering under-device metallization layer 55. Passivation layer 60 may include commonly used passivation materials such as silicon oxide, silicon oxynitride (SiON), polyimide, silicon nitride (SiN), silicon oxycarbide (SiOC), and the like. Dielectric layer 46 is then removed, preferably using CMP.

After the removal of dielectric layer 46, contact plugs 62 and 64 and a metallization layer one (M1) 66 are formed. M1 66 is equally referred to as an over-device metallization layer. The formation processes for contact plugs 62 and 64 and over-device metallization layer 66 are well known in the art, and thus are not repeated herein. It is noted that through a contact plug 54, the connecting electrode 36, and the contact plug 64, the connection to a source/drain region 40 is routed to over-device metallization layer 66. In subsequent processes, inter-metal dielectric (IMD) layers and more over-device metallization layers (symbolized by dots), each in a respective IMD layer, are formed. The process is similar to conventional interconnect structure formation processes, and thus is not repeated herein.

Figure 11:
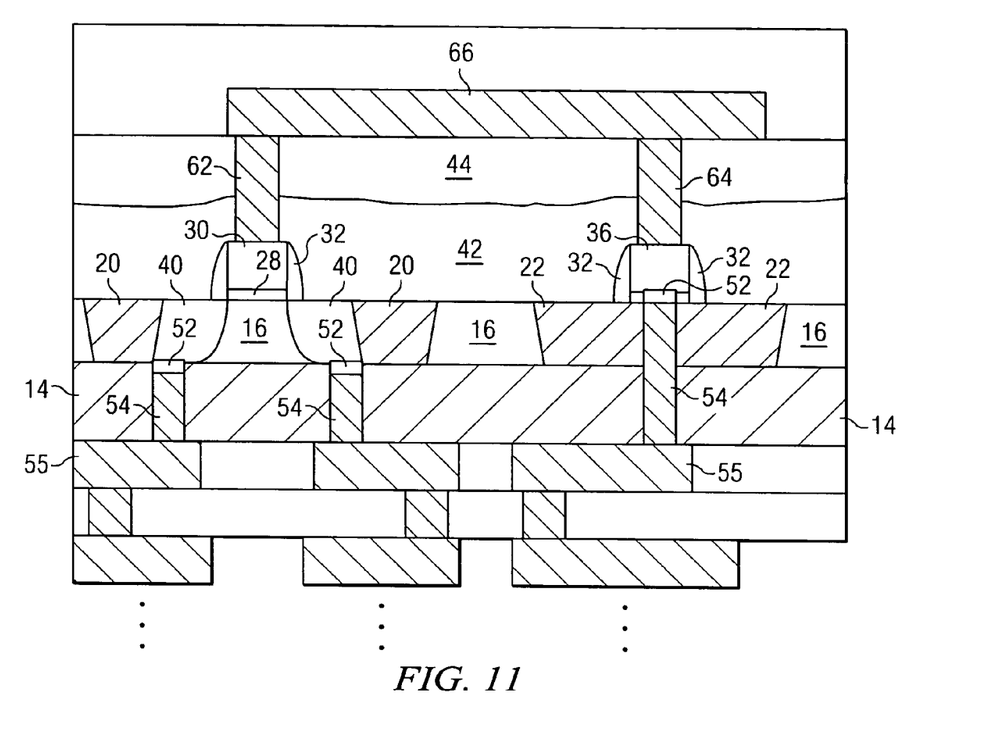
FIG. 11 is a cross-sectional view of a second embodiment, wherein under-device metallization layers are formed under a MOS device.

In the previously discussed embodiment, only one under-device metallization layer is formed underlying MOS device 38, and the rest of the metallization layers are formed as over-device metallization layers. In other embodiments, only one over-device metallization layer is formed over MOS device 38, and the rest are formed as under-device metallization layers. An exemplary embodiment with under-device metallization layers is shown in FIG. 11. In an exemplary formation process, after the structure shown in FIG. 6 is formed, CESL 42, ILD 44 and over-device metallization layer 66 are formed. It is to be noted that gate electrode 30 is preferably interconnected through over-device metallization layer 66 to the connecting electrode 36, which is further connected to under-device metallization layer 55. Therefore, gate electrode 30 and source/drain regions 40 all have connections to under-device metallization layer 55. Additional under-device metallization layers (symbolized by dots and an exemplary under-device metallization layer two) can then be formed on under-device metallization layer 55. The formation process is essentially the same as that for forming metallization layers over MOS devices. It is to be understood that integrated circuits typically include other devices such as resistors. If feasible, backside contacts are preferably formed to connect to such devices. Otherwise, these devices may be connected to the under-device metallization layers by forming contact plugs through BOX 14.

Figure 12:
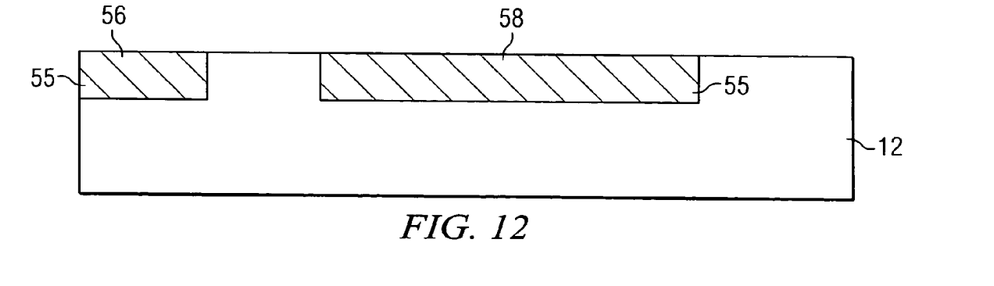
FIGS. 12 through 14 are cross-sectional views of intermediate stages in the manufacture of a third embodiment, wherein an under-device metallization layer is formed before the formation of a MOS device.

In a third embodiment of the present invention, a similar structure as in FIG. 10 is formed, however, it is formed using a different approach. The formation steps are briefly described using FIGS. 12 through 14. Referring to FIG. 12, a substrate 12 is provided. Substrate 12 is preferably a semiconductor substrate. Alternatively, it comprises dielectric materials. A metallization layer 55, which includes metal lines 56 and 58, is formed. In one embodiment, metallization layer 55 is formed by forming trenches in substrate 12, and then filling the trenches with conductive materials. Alternatively, a metal layer, which preferably comprises aluminum, tungsten, silver, and other commonly used metals, is formed. The metal layer is then patterned to form metal lines including metal lines 56 and 58. The vacancies between the metal lines are then filled with dielectric materials, preferably with low k values, for example, less than about 3.9.

Figure 13:
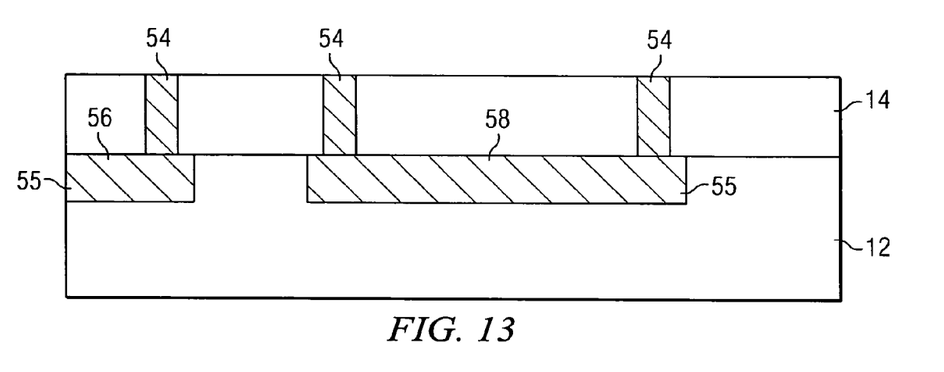

A dielectric layer, which is essentially the same as BOX 14 in the previously described embodiment, is then deposited, as is shown in FIG. 13. Contact plugs 54 are then formed in BOX 14 and connected to respective metal lines 56 and 58. A second substrate 16 is then formed/bonded onto the previously formed structure to form a silicon-on-insulator (SOI) structure. Since the thickness of the bonded second substrate 16 is typically much greater than a desired value, a chemical mechanical polish (CMP) is performed to reduce second substrate 16 to the desired thickness.

Figure 14:
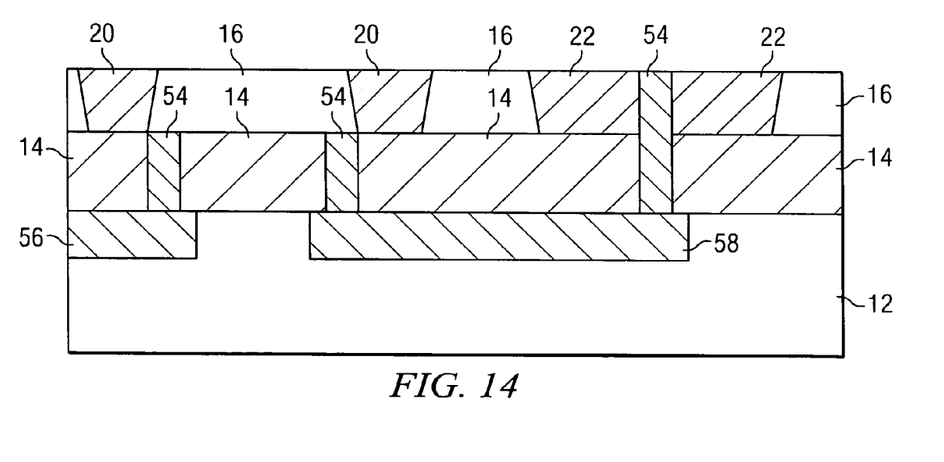

After second substrate 16 is bonded, STI regions 20 and 22 are formed. A contact is further formed in STI region 22 to extend the underlying contact plug 54 to the top surface of STI region 22, as illustrated in FIG. 14. A MOS device 38 and connecting electrode 36 are then formed using essentially the same method as previously discussed (referring back to FIG. 10). Preferably, dielectric layer 34 is not formed on STI region 22 so that the connecting electrode 36 may connect to the underlying contact plug 54. Alternatively, the connecting electrode 36 and dielectric layer 34 are not formed, and the subsequently formed contact plug 64 extends to the bottom of second substrate 16, connecting directly to the underlying contact plug 54. CESL 42 and ILD 44 are then formed. The subsequent process steps include forming contact plugs 62 and 64 in ILD 44, forming over-device metallization layer 66 connecting to contact plugs 62 and 64, and forming more over-device metallization layers over the first metallization layer 66.

By forming source/drain contacts from the backside of the MOS devices, no contact holes are formed, thus the cutting effects are significantly reduced. As a result, the stresses applied to the channel regions by the CESLs are increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate having a first surface and an opposing second surface;
    a gate dielectric over the first surface of the semiconductor substrate;
    a gate electrode over the gate dielectric;
    a source/drain region having at least a portion in the semiconductor substrate;
    a dielectric layer having a first surface and an opposing second surface, wherein the first surface of the dielectric layer adjoins the second surface of the semiconductor substrate; and
    a first contact plug in the dielectric layer, wherein the first contact plug extends from a bottom side of the source/drain region to the second surface of the dielectric layer, and wherein the first contact plug comprises a silicide region adjoining the source/drain region.

2. The semiconductor structure of claim 1 further comprising an under-device metallization layer on the second surface of the dielectric layer, wherein the under-device metallization layer is connected to the first contact plug.

3. The semiconductor structure of claim 2, wherein the semiconductor structure further comprises:
    a shallow trench isolation (STI) region in the semiconductor substrate and adjoining the dielectric layer;
    a second contact plug in the STI region, wherein the second contact plug is further connected to a third contact plug in the dielectric layer, and wherein the third contact plug is connected to the under-device metallization layer; and
    a connecting electrode over the STI region, wherein the second contact plug is connected to the connecting electrode.

4. The semiconductor structure of claim 3, wherein the connecting electrode is connected to the first contact plug through the under-device metallization layer.

5. The semiconductor structure of claim 3, wherein the connecting electrode is connected to the gate electrode through an over-device metallization layer over the gate electrode.

6. The semiconductor structure of claim 2 further comprising a plurality of under-device metallization layers on a same side of the semiconductor substrate as, and over, the under-device metallization layer.

7. The semiconductor structure of claim 2 further comprising a plurality of over-device metallization layers on an opposite side of the semiconductor substrate from the under-device metatlization layer.

8. The semiconductor structure of claim 1 further comprising a contact etch stop layer (CESL) over the gate electrode and the source/drain region, wherein the CESL has an inherent stress.

9. The semiconductor structure of claim 8, wherein a thickness of the CESL is between about 700 Å and about 2000 Å.

10. A semiconductor structure comprising:
    a semiconductor layer comprising a first side and an opposing second side;
    a buried oxide (BOX) layer directly on a top surface of the second side of the semiconductor layer;
    a gate dielectric over a top surface of the semiconductor layer on the first side;
    a gate electrode over the gate dielectric;
    a source/drain region in the semiconductor layer, wherein the source/drain region and the BOX layer have an interface;
    a first contact plug in the dielectric layer and connected to the interface;
    an over-device metallization layer over and on the first side of the semiconductor layer; and
    an under-device metallization layer on the second side of the semiconductor layer, wherein the under-device metallization layer is connected to the first contact plug, and wherein the over-device metallization layer and the under-device metallization layer are electrically interconnected through contact plugs.

11. The semiconductor structure of claim 10 further comprising:
    a shallow trench isolation (STI) region in the semiconductor layer;
    a second contact plug in the STI region; and
    a connecting electrode over the STI region, wherein the second contact plug and the connecting electrode are interconnected and are further connected to the over-device metallization layer and the under-device metallization layer.

12. The semiconductor structure of claim 10 further comprising a plurality of inter-metal dielectric (IMD) layers and a plurality of over-device metallization layers in respective IMD layers, wherein the plurality of IMD layers and the plurality of over-device metallization layers are on the first side of the dielectric layer.

13. The semiconductor structure of claim 10 further comprising a plurality of inter-metal dielectric (IMD) layers and a plurality of under-device metallization layers in respective IMD layers, wherein the plurality of IMD layers and the plurality of under-device metallization layers are on the second side of the dielectric layer.

14. The semiconductor structure of claim 10 further comprising a contact etch stop layer over the source/drain region.

15. A semiconductor structure comprising:
    a semiconductor substrate having a first surface and an opposing second surface;
    a gate dielectric over the first surface of the semiconductor substrate;
    a gate electrode over the gate dielectric;
    a source/drain region having at least a portion in the semiconductor substrate;
    a contact etch stop layer (CESL) over the gate electrode and the source/drain region, wherein the CESL has an inherent stress, and wherein a thickness of the CESL is between about 700 Å and about 2000 Å;
    a dielectric layer having a first surface and an opposing second surface, wherein the first surface of the dielectric layer adjoins the second surface of the semiconductor substrate; and
    a first contact plug in the dielectric layer, wherein the first contact plug extends from a bottom side of the source/drain region to the second surface of the dielectric layer.

16. The semiconductor structure of claim 15 further comprising an under-device metallization layer on the second surface of the dielectric layer, wherein the under-device metallization layer is connected to the first contact plug.

17. The semiconductor structure of claim 16, wherein the semiconductor structure further comprises:
    a shallow trench isolation (STI) region in the semiconductor substrate and adjoining the dielectric layer;
    a second contact plug in the STI region, wherein the second contact plug is further connected to a third contact plug in the dielectric layer, and wherein the third contact plug is connected to the under-device metallization layer; and a connecting electrode over the STI region, wherein the second contact plug is connected to the connecting electrode.

18. The semiconductor structure of claim 17, wherein the connecting electrode is connected to the first contact plug through a metallization layer selected from the group consisting essentially of the under-device metallization layer and an over-device metallization layer.

* * * * *